US007945873B2

(12) United States Patent
Watanabe et al.

(10) Patent No.: US 7,945,873 B2
(45) Date of Patent: May 17, 2011

(54) MASK PATTERN DATA GENERATING METHOD, INFORMATION PROCESSING APPARATUS, PHOTOMASK FABRICATION SYSTEM, AND IMAGE SENSING APPARATUS

(75) Inventors: Kyouhei Watanabe, Machida (JP); Masaki Kurihara, Koza-gun (JP); Hitoshi Shindo, Hadano (JP); Nobuhiko Sato, Yokohama (JP); Yasuhiro Sekine, Yokohama (JP); Masataka Ito, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 516 days.

(21) Appl. No.: 12/048,691

(22) Filed: Mar. 14, 2008

(65) Prior Publication Data

US 2008/0263502 A1    Oct. 23, 2008

(30) Foreign Application Priority Data

Apr. 17, 2007 (JP) .................................. 2007-108664
Dec. 26, 2007 (JP) .................................. 2007-335063

(51) Int. Cl.
*G06F 17/50* (2006.01)
(52) U.S. Cl. ............................. 716/55; 716/53; 716/119
(58) Field of Classification Search ................... 716/53, 716/55, 119
See application file for complete search history.

(56) References Cited

U.S. PATENT DOCUMENTS

| 6,091,492 A * | 7/2000 | Strickland et al. ............ 356/336 |
| 7,564,590 B2 | 7/2009 | Sugimoto |
| 2006/0046162 A1 | 3/2006 | Sekine ............................. 430/5 |

FOREIGN PATENT DOCUMENTS

| JP | 5-142752 | | 6/1993 |
| JP | 6-109904 | A | 4/1994 |
| JP | 11-017945 | A | 1/1999 |
| JP | 2001-356470 | A | 12/2001 |
| JP | 2004-70087 | | 3/2004 |
| JP | 2004-144841 | | 5/2004 |
| JP | 2004-145319 | | 5/2004 |
| JP | 2004-296590 | | 10/2004 |
| JP | 2005-258349 | | 9/2005 |
| JP | 2006-98985 | | 4/2006 |
| JP | 2006-278356 | | 10/2006 |
| JP | 2007-013640 | A | 1/2007 |

OTHER PUBLICATIONS

Japanese Office Action dated Jun. 21, 2010, which issued in counterpart Japanese patent application No. 2007-335063.

* cited by examiner

*Primary Examiner* — Thuan Do
(74) *Attorney, Agent, or Firm* — Fitzpatrick, Cella, Harper & Scinto

(57) ABSTRACT

A method of generating mask pattern data of a photomask used to form microlenses divides a pattern formation surface of a mask pattern to be used for the photomask into a plurality of grid cells, acquires data that represent a transmitted light distribution of the mask pattern to be used for the photomask, determines whether to place a shield on each of the plurality of grid cells by binarizing the plurality of grid cells in order of increasing or decreasing distance from a center of the pattern formation surface using an error diffusion method, to acquire the transmitted light distribution, and generates mask pattern data that represent an arrangement of the shields, based on the determination.

9 Claims, 17 Drawing Sheets

FIG. 5B

X COORDINATE

|  | −1.35 | −1.29 | −1.23 | −1.17 | −1.11 | −1.05 |
|---|---|---|---|---|---|---|
| 1.35 | 0.997 | 0.973 | 0.95 | 0.928 | 0.906 | 0.885 |
| 1.29 | 0.973 | 0.949 | 0.926 | 0.903 | 0.881 | 0.859 |
| 1.23 | 0.95 | 0.926 | 0.902 | 0.878 | 0.856 | 0.834 |
| 1.17 | 0.928 | 0.903 | 0.878 | 0.855 | 0.831 | 0.809 |
| 1.11 | 0.908 | 0.881 | 0.856 | 0.831 | 0.808 | 0.785 |
| 1.05 | 0.885 | 0.859 | 0.834 | 0.809 | 0.785 | 0.761 |

Y COORDINATE

FIG. 6A

| 0.4 | 0.4 | 0.4 | 0.4 | 0.4 |
|-----|-----|-----|-----|-----|
| 0.4 | 0.2 | 0.2 | 0.2 | 0.4 |
| 0.4 | 0.2 | 0.1 | 0.2 | 0.4 |
| 0.4 | 0.2 | 0.2 | 0.2 | 0.4 |
| 0.4 | 0.4 | 0.4 | 0.4 | 0.4 |

FIG. 6B

| 0.4 | 0.4 | 0.4 | 0.4 | 0.4 |
|-----|-----|-----|-----|-----|
| 0.4 | 0.2 (7) | (1) 0.2 | (2) 0.2 | 0.4 |
| 0.4 | 0.2 (8) | 0 | (3) 0.2 | 0.4 |
| 0.4 | 0.2 (6) | (5) 0.2 | (4) 0.2 | 0.4 |
| 0.4 | 0.4 | 0.4 | 0.4 | 0.4 |

| 0.4 | 0.4 | 0.4 | 0.4 | 0.4 |
|-----|-----|-----|-----|-----|
| 0.4 | 0.21 | 0.22 | 0.21 | 0.4 |
| 0.4 | 0.22 | 0 | 0.22 | 0.4 |
| 0.4 | 0.21 | 0.22 | 0.21 | 0.4 |
| 0.4 | 0.4 | 0.4 | 0.4 | 0.4 |

▨ GRID CELLS AFTER ERROR DIFFUSION PROCESSING
▥ GRID CELLS GOING THROUGH ERROR DIFFUSION PROCESSING

FIG. 6D

| 0.4 | 0.4 | 0.4 | 0.4 | 0.4 |
|---|---|---|---|---|
| 0.4 | 0.21 | 0.22 | 0.21 (1) (2) | 0.4 |
| 0.4 | 0.22 | (7) 0 | 0 (3) | 0.4 |
| 0.4 | 0.21 | 0.22 (6) 0.21 (5) (4) | | 0.4 |
| 0.4 | 0.4 | 0.4 | 0.4 | 0.4 |

| 0.4 | 0.4 | 0.4 | 0.4 | 0.4 |
|---|---|---|---|---|
| 0.4 | 0.21 | 0.24 | 0.25 | 0.42 |
| 0.4 | 0.22 | 0 | 0 | 0.44 |
| 0.4 | 0.21 | 0.24 | 0.25 | 0.42 |
| 0.4 | 0.4 | 0.4 | 0.4 | 0.4 |

▧ GRID CELLS AFTER ERROR DIFFUSION PROCESSING

▨ GRID CELLS GOING THROUGH ERROR DIFFUSION PROCESSING

|  |  |  |
|:---:|:---:|:---:|
| 0.5 | 1 | 0.5 |
| 1 |  | 1 |
| 0.5 | 1 | 0.5 |

GRID CELL GOING THROUGH ERROR DIFFUSION PROCESSING

MASK PATTERN DATA GENERATING METHOD, INFORMATION PROCESSING APPARATUS, PHOTOMASK FABRICATION SYSTEM, AND IMAGE SENSING APPARATUS

This application claims the benefit of Japanese Patent Application No. 2007-108664, filed Apr. 17, 2007, and Japanese Patent Application No. 2007-335063, filed Dec. 26, 2007, which are hereby incorporated by reference herein in their entirety.

BACKGROUND OF THE INVENTION

1. Field of the Invention

The present invention relates to the fabrication of photomasks, and, more particularly, to the fabrication of photomasks used to form microlenses, located above a light-receiving unit used for photoelectric conversion in an image sensing apparatus, such as a CCD sensor or a CMOS sensor.

2. Description of the Related Art

Conventionally, image sensing apparatuses contain a condensing microlens for each pixel, to increase the light collection efficiency of a light-receiving unit.

The microlenses are formed as follows: a photosensitive resin is formed into a pattern of separated spots, corresponding to individual pixels, by a photolithographic method, the resin pattern of separated spots is softened by heating, and a surface of the resin pattern is made spherical by surface tension.

With the refinement of pixels, the sensitivity of the image sensing apparatus is decreasing. Thus, it is desired to reduce spacing between the microlenses, to collect light entering between the microlenses. However, with methods that soften the resin pattern by heating, it is difficult to reduce the spacing between the microlenses. This is because some gap must be provided between the lenses to prevent contact between adjacent lenses when the resin is softened by heat treatment.

On the other hand, methods have been proposed that form microlenses by exposing a photosensitive resin placed under a photomask, and then developing the exposed photosensitive resin, in which the photomask is capable of controlling a transmitted quantity of exposure light by a dot pattern consisting of microdots (see, for example, Japanese Patent Laid-Open Nos. 2004-145319 and 2004-70087).

SUMMARY OF THE INVENTION

The present invention provides for an arrangement that prevents symmetry of the dot pattern from lowering.

A first aspect of the present invention relates to a method of generating mask pattern data of a photomask used to form microlenses. The method comprises the steps of dividing a pattern formation surface of a mask pattern to be used for the photomask into a plurality of grid cells, acquiring data that represents a transmitted light distribution of the mask pattern to be used for the photomask, determining whether to place a shield on each of the plurality of grid cells, by binarizing the plurality of grid cells, in order of increasing or decreasing distance from a center of the pattern formation surface using an error diffusion method to acquire the transmitted light distribution, and generating mask pattern data that represents an arrangement of the shields based on the results from the determining step.

A second aspect of the present invention relates to an information processing apparatus that comprises a unit configured to divide a pattern formation surface of a mask pattern to be used for a photomask into a plurality of grid cells, a unit configured to acquire data that represents a transmitted light distribution of the mask pattern to be used for a photomask used to form microlenses, a unit configured to determine whether to place a shield on each of the plurality of grid cells by binarizing the plurality of grid cells, in order of increasing or decreasing distance from a center of the pattern formation surface using an error diffusion method, to acquire the transmitted light distribution, and a unit configured to generate mask pattern data that represents an arrangement of the shields, based on results from the determining unit.

A third aspect of the present invention relates to a photomask fabrication system that comprises the information processing apparatus according to the second aspect, and a drawing apparatus configured to fabricate a photomask, based on the mask pattern data generated by the information processing apparatus.

A fourth aspect of the present invention relates to an image sensing apparatus that comprises a photoelectric conversion unit configured to convert light into a signal charge, and microlenses formed using the photomask fabricated by the photomask fabrication system, and configured to collect and to focus light onto the photoelectric conversion unit.

The present invention makes it possible to prevent the symmetry of the dot pattern from lowering.

Further features of the present invention will become apparent from the following description of exemplary embodiments (with reference to the attached drawings).

BRIEF DESCRIPTION OF THE DRAWINGS

FIG. 5B is a diagram showing a list of values of transmitted light quantity z, corresponding to x, y coordinate values, in part of the transmitted light distribution shown in FIG. 5A;

FIGS. 6A to 6E are diagrams illustrating a binarization process using an error diffusion method according to the first preferred embodiment of the present invention;

DESCRIPTION OF THE EMBODIMENTS

Studies conducted by the inventors have revealed that with the techniques described in Japanese Patent Laid-Open Nos. 2004-145319 and 2004-70087, arrangement of the dot pattern is not concentric with the pixel center, and has low symmetry with respect to the pixel center. With such a dot pattern arrangement, a transmitted light distribution is not spherical, and is asymmetrical with respect to the pixel center. This makes it possible to give a desired shape to the microlenses. This, in turn, may cause optical characteristics (focal length, proportionality of F number, etc.) to deviate from design values. Thus, the present invention provides an arrangement that prevents the symmetry of the dot pattern from lowering.

Preferred embodiments of the present invention will be described in detail below, with reference to the drawings.

First Embodiment

Figure 1:
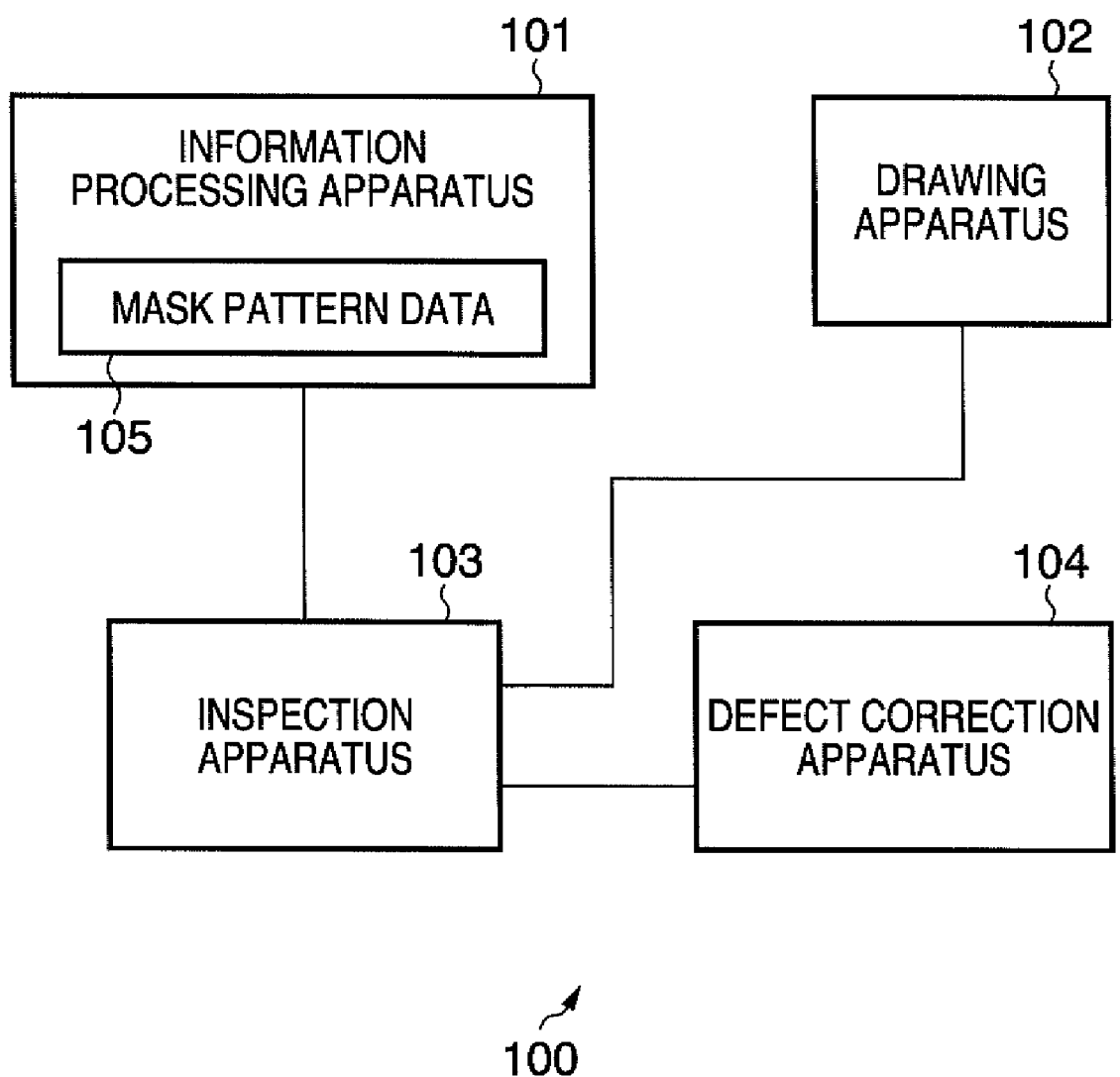
FIG. 1 is a block diagram showing a configuration of a photomask fabrication system according to a first preferred embodiment of the present invention.

FIG. 1 is a block diagram showing a configuration of a photomask fabrication system according to a first preferred embodiment of the present invention.

In FIG. 1, the photomask fabrication system 100 includes an information processing apparatus 101, a drawing apparatus 102, an inspection apparatus 103, and a defect correction apparatus 104. The information processing apparatus 101 generates mask pattern data 105 based on various acquired data, described later. Furthermore, the information processing apparatus 101 converts the generated mask pattern data 105 into drawing data compatible with the drawing apparatus 102. The drawing apparatus 102 fabricates a photomask by a reduced transfer or direct drawing method based on the drawing data created by the information processing apparatus 101. The inspection apparatus 103 checks the photomask for defects to see whether the dot pattern has been formed as designed. Various inspection methods are available including, for example, a method that involves comparing the mask pattern data 105 with an electrical signal of an optical image of the photomask, but the present invention is not limited to any particular inspection method. The defect correction apparatus 104 corrects the defects detected by the inspection apparatus 103. Various correction methods are available including, for example, a laser beam method and an ion beam method, but the present invention is not limited to any particular correction method. Incidentally, the mask pattern data 105 is design data used by the drawing apparatus 102 to draw a mask pattern. Also, the drawing data is the mask pattern data converted into a format compatible with the drawing apparatus 102.

Figure 2:
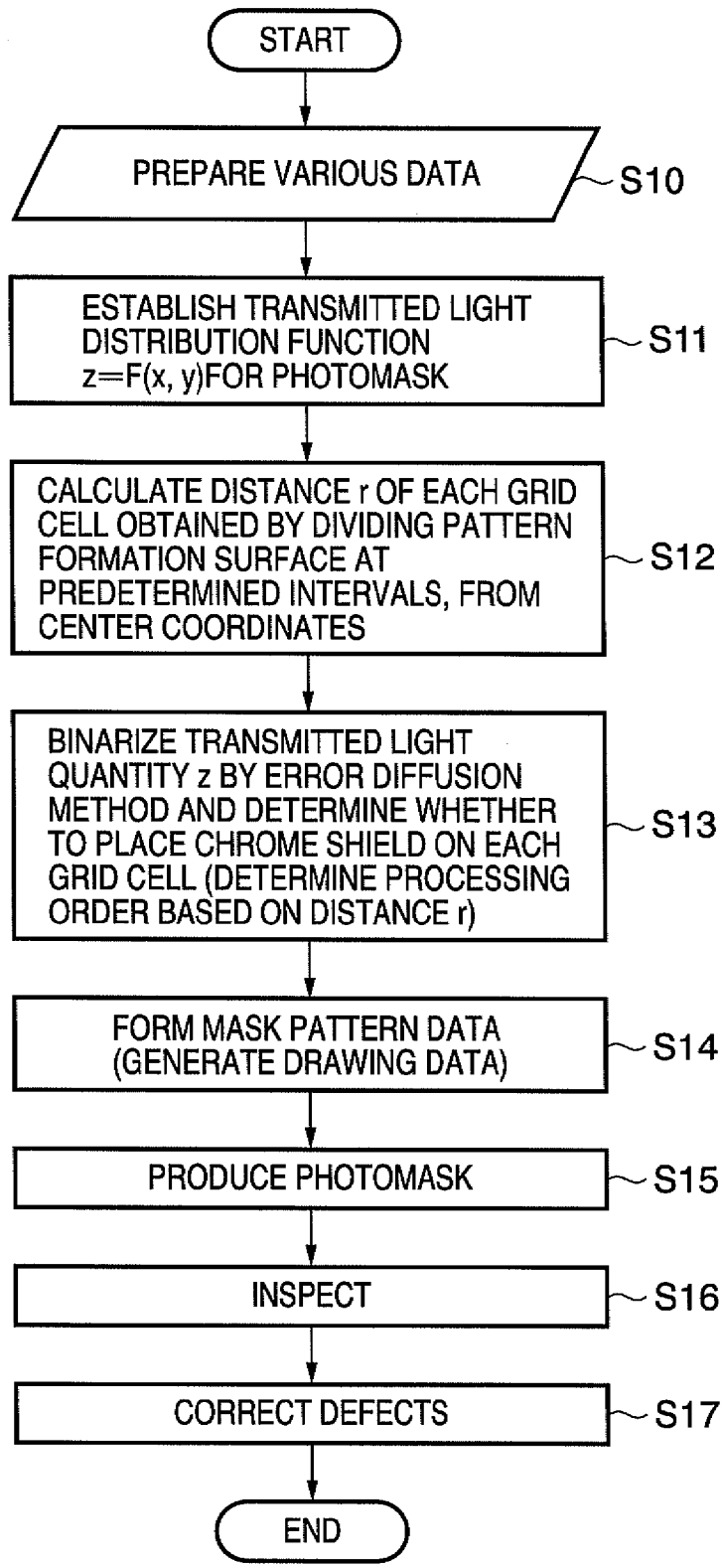
FIG. 2 is a flowchart showing a photomask fabrication method that uses the photomask fabrication system.

FIG. 2 is a flowchart showing a photomask fabrication method that uses the photomask fabrication system 100.

Figure 3:
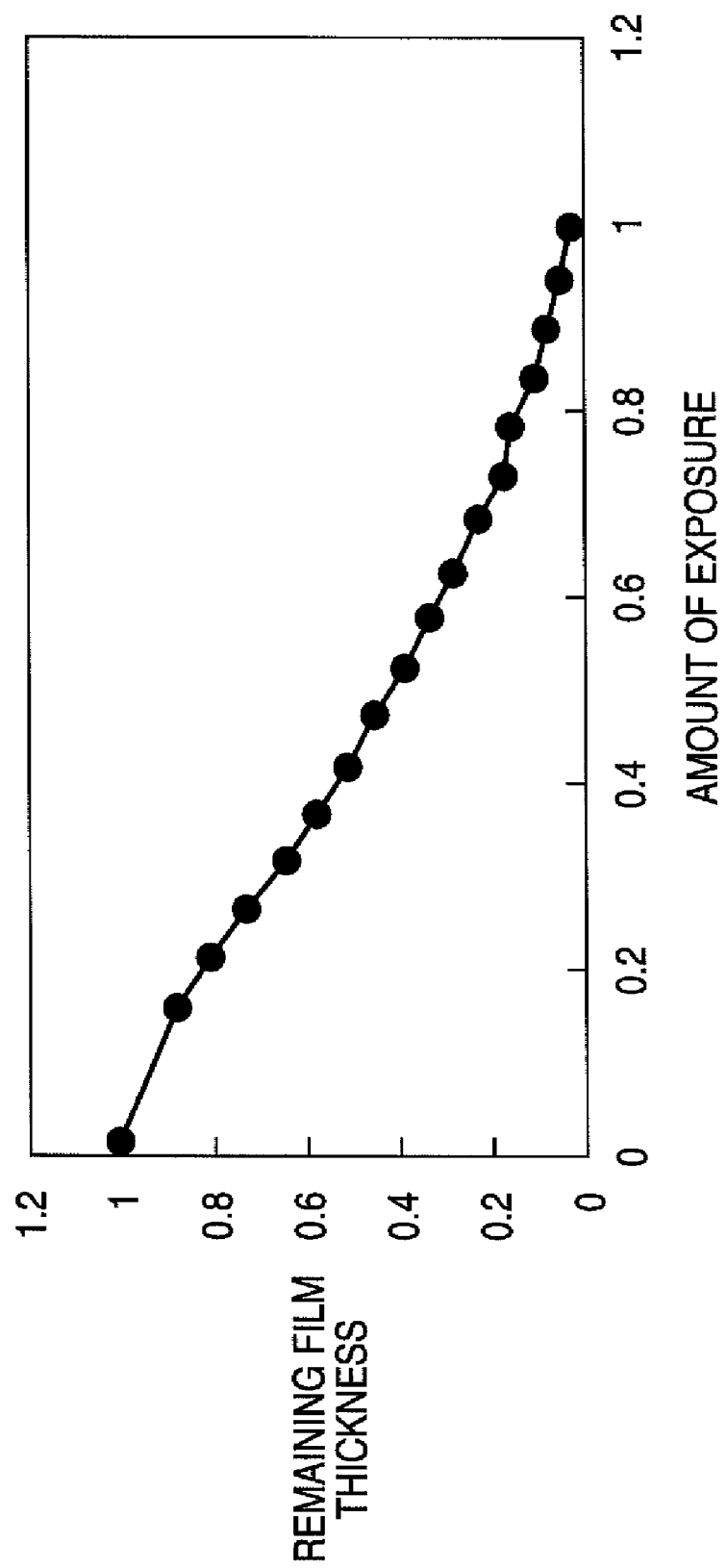
FIG. 3 is a diagram showing a sensitivity curve of a positive photosensitive resin.

In Step S10, various data are prepared. The various data include a sensitivity curve of a photosensitive resin used to form minute lenses (hereafter referred to as "microlenses"), and data regarding a desired lens shape. The sensitivity curve of the photosensitive resin used to form the microlenses represents changes in remaining film thickness of the photosensitive resin with an amount of exposure. Normally, a positive photosensitive resin has a sensitivity curve, such as shown in FIG. 3. Incidentally, in FIG. 3, both the amount of exposure and remaining film thickness have been normalized.

Figure 4:
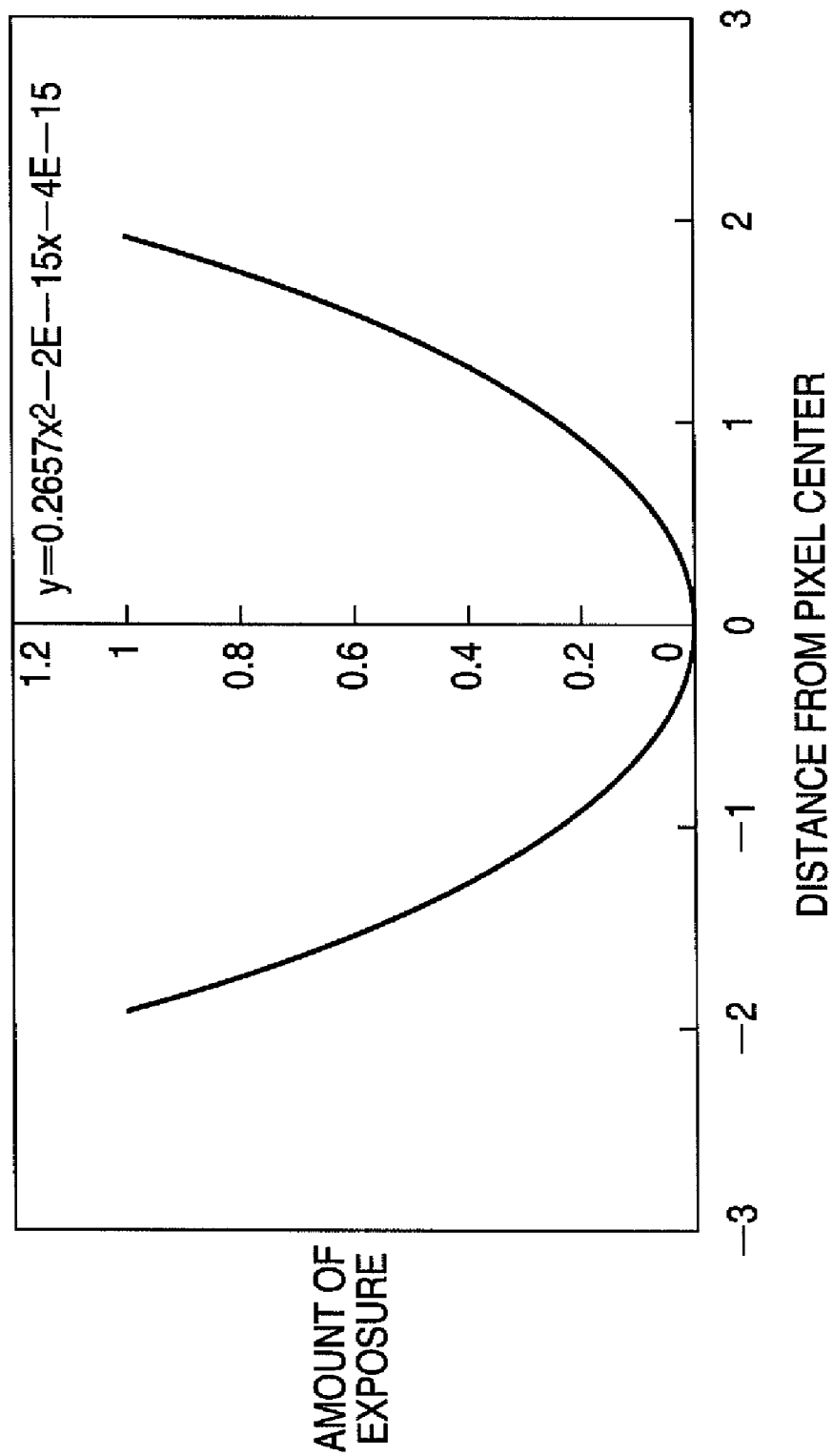
FIG. 4 is a diagram showing a relationship between distance from a center of a pixel and a quantity of transmitted light (amount of exposure) using the sensitivity curve shown in FIG. 3.

In Step S11, the information processing apparatus 101 establishes a function $z=F(x,y)$, which represents the transmitted light distribution of the mask pattern to be used for a photomask, based on the various data prepared in Step S10. The use of the sensitivity curve prepared in Step S10 makes it possible to express the quantity of transmitted light (amount of exposure of an irradiated body) required to form a desired lens shape as a function of position on an X-Y plane (pattern formation surface), on which the pattern of the photomask is formed. As an example, suppose a lens shape is created using the sensitivity curve shown in FIG. 3. If the distance from the pixel center is taken as the position on the X-Y plane, a relationship between the distance from the pixel center and a quantity of transmitted light (also known as transmittance) can be approximated by a quadratic function, such as shown in FIG. 4. The information processing apparatus 101 calculates a z coordinate value corresponding to x, y coordinate values of each grid cell, and representing a transmitted light quantity when the X-Y plane forming the pattern of the photomask is divided into multiple grid cells with a grid pitch of $W_1$. Consequently, the quadratic function that represents the relationship between the distance from the pixel center and the quantity of transmitted light is given as $z=F(x,y)$.

Figure 5A:
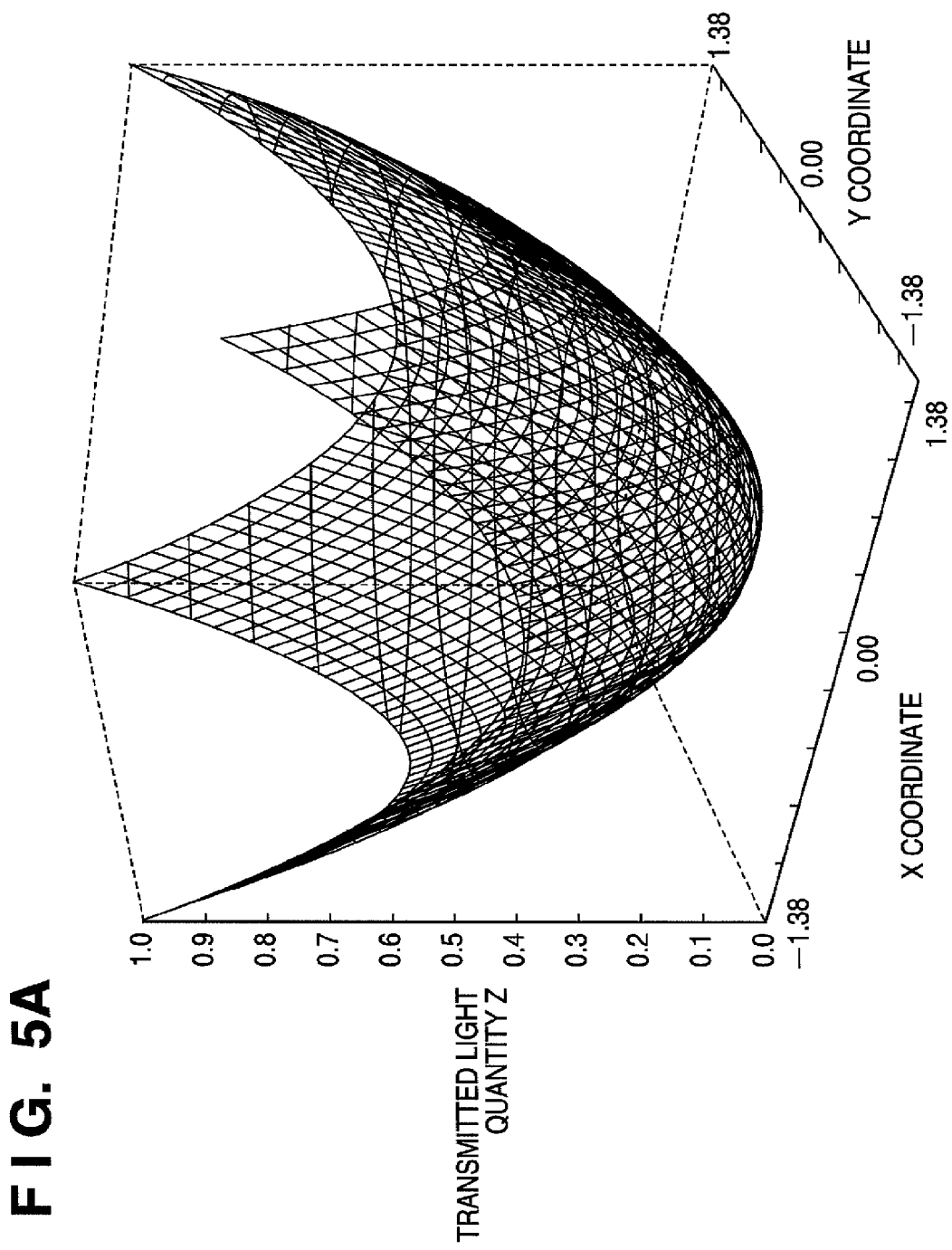
FIG. 5A is a diagram showing a transmitted light distribution in a pixel needed to obtain a desired lens shape.

The z values corresponding to the x, y coordinate values are calculated using the quadratic function established in Step S11, and are used to determine a distribution shown in FIG. 5A, that is, the transmitted light distribution in a pixel needed to obtain the desired lens shape. FIG. 5B is a list of values of the transmitted light quantity z, corresponding to the x, y coordinate values in part of the transmitted light distribution shown in FIG. 5A. The pitch $W_1$ used to calculate the values of the transmitted light quantity z is set to be less than the minimum resolvable distance (equivalent to resolution) of an exposure apparatus used for formation of the microlenses. For example, when an exposure light beam with a wavelength of 365 nm and a 4× reticle (photomask) are used, if one side of each dot on the photomask is 0.96 μm (=960 nm) or longer, individual dots in the dot pattern on the photomask will appear to be separated on the photosensitive resin. It has been confirmed experimentally that a desired smooth lens shape cannot be obtained consequently. A lower limit of one side is determined based on the minimum resolvable distance of the drawing apparatus 102. On the other hand, it has been confirmed that if one side of each dot on the photomask is between 0.24 μm (=240 nm) and 0.72 μm (=720 nm) in length, individual dots do not appear to be separated with a wavelength of the exposure light being 365 nm. Thus, it is preferable that the grid pitch $W_1$ of the drawing apparatus 102 falls within the range of 60 nm to 180 nm (240 nm to 720 nm on the photomask). The "dot" here means a sheild having the same shape as that of the grid cell, and one dot is placed at the center of gravity of each grid cell. Also, preferably, the dot (shield) does not have an acute angle, and, more preferably, the grid cells are square.

In Step S12, a distance r of each grid cell at coordinates (x, y) from the pixel center (x0, y0) is calculated using Formula 1, in which the grid cells are obtained by dividing the X-Y plane at predetermined intervals.

$$r=((x-x_0)^2+(y-y_0)^2)^{1/2} \quad \text{(Formula 1)}$$

In Step S13, to control the transmitted light quantity of the exposure light, the information processing apparatus 101 binarizes, in an order described later, the calculated z coordinate values, which represent the transmitted light quantity using an error diffusion method (random dithering). Then, the information processing apparatus 101 determines whether to place a chrome shield (shield) on each cell of the divided grid, and generates a dot pattern with each dot being $W_1$ long on a side.

In Step S14, the information processing apparatus 101 generates mask pattern data (FIG. 9B) by placing the dot pattern generated in Step S13 on the X-Y plane using a CAD or other drawing apparatus. Furthermore, the information processing apparatus 101 converts the generated mask pattern data into drawing data compatible with the drawing apparatus 102.

In Step S15, the drawing apparatus 102 produces a photomask using the drawing data generated in Step S14.

In Step S16, the inspection apparatus 103 checks whether the pattern has been formed as designed.

In Step S17, the defect correction apparatus 104 corrects any defect detected by the inspection apparatus 103.

Next, procedures of a binarization process using an error diffusion method in Step S13 in FIG. 2 will be described in detail, with reference to FIGS. 6A to 6E.

In FIGS. 6A to 6E, it is assumed that horizontal and vertical directions correspond to X and Y coordinate directions, respectively, and that the z coordinate values, corresponding to the x, y coordinate values, and representing the quantity of transmitted light, are arranged in the cells of the grid divided at predetermined intervals. A 5×5 grid is taken as an example in FIGS. 6A to 6E, but the present invention is not limited to this. The binarization here involves assigning a value of one to the grid cells, in which the value of the quantity of transmitted light is larger than a threshold, and assigning a value of zero to the grid cells, in which the value of the quantity of transmitted light is less than the threshold. According to the present embodiment, the threshold used in the binarization is 0.56, which is the intermediate value of the transmitted light quantity, but the present invention is not limited to this. The grid cells to which one is assigned constitute apertures (no chrome shield film) and the grid cells to which zero is assigned constitute shields (i.e., dots; with a chrome shield film). The binarization process starts with the grid cell at the pixel center and proceeds counterclockwise in order of increasing distance r from the pixel center.

First, as shown in FIG. 6A, as a result of binarization using the intermediate value of 0.5 as the threshold, a quantity of transmitted light of 0.1 is reduced to zero at the grid cell at the pixel center.

Figure 7:
FIG. 7 is a diagram showing an example of weighting.

Next, as shown in FIG. 6B, an error (0.1−0=0.1), resulting from the binarization, is weighted and added to (or subtracted from) the eight grid cells adjacent to the binarized grid cell. FIG. 7 is a diagram showing an example of weighting. In FIG. 7, a weight of one is assigned to the vertically adjacent grid cells and horizontally adjacent grid cells, while a weight of 0.5 is assigned to the grid cells at the upper left, upper right, lower left, and lower right. Thus, the quantity of transmitted light of the upper-adjacent grid cell ((1) in FIG. 6B) is 0.2+0.1/(1+1+1+1+0.5+0.5+0.5+0.5)=0.22. Similarly, the quantities of transmitted light of the other adjacent grid cells are weighted according to a weighting rule shown in FIG. 7.

Next, the binarization process moves to an adjacent grid cell, as shown in FIG. 6C. The grid cell, which has a quantity of transmitted light of 0.22, is assigned zero as a result of binarization using the intermediate value of 0.5 as the threshold.

Next, as shown in FIG. 6D, an error (0.22−0=0.22), resulting from the binarization, is weighted and added to (or subtracted from) the seven grid cells adjacent to the binarized grid cell, according to the weighting rule shown in FIG. 7. In FIG. 6D, the quantity of transmitted light of the upper-adjacent grid cell is 0.21+0.22/(1+1+1+1+0.5+0.5+0.5+0.5)=0.22. Similarly, the quantities of transmitted light of the other adjacent grid cells are weighted according to the weighing rule shown in FIG. 7. The weighted error is not added to (or subtracted from) the grid cells, which have already gone through binarization.

In FIG. 6E, similar processes are performed in the order indicated by the arrows. That is, if grid cells are processed beginning with the grid cell at the pixel center, the grid cells are processed in the order: the right, upper, left, lower, upper right, upper left, lower left, and lower right grid cells. Then, the outer grid cells are processed in order of increasing distance r from the pixel center. In this way, since grid cells are binarized spirally in order of increasing distance r from the pixel center, it is possible to obtain a highly symmetrical dot pattern arrangement concentric with the pixel center.

Figure 9A:
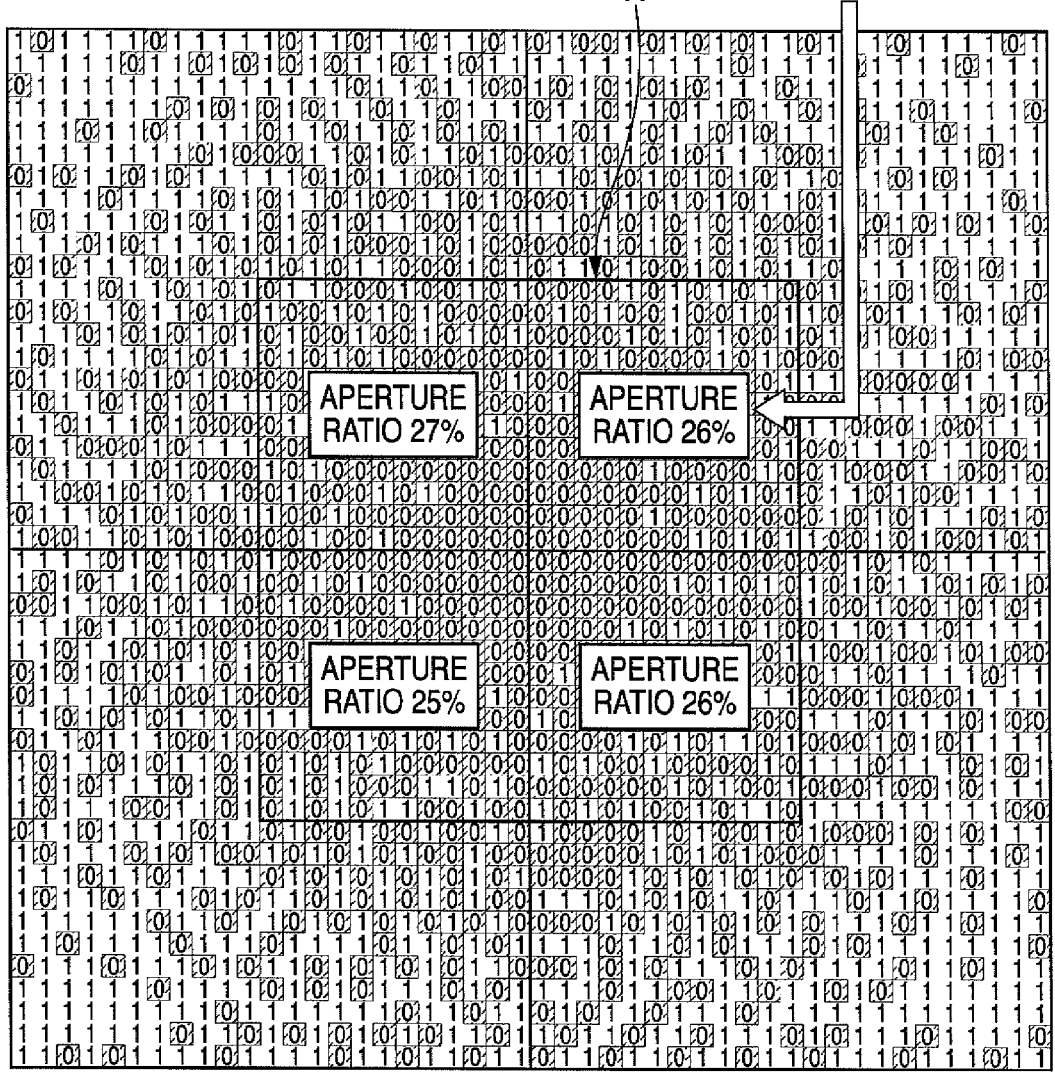
FIGS. 9A and 9B are diagrams showing a dot pattern obtained by the binarization process using the error diffusion method according to the first preferred embodiment of the present invention.
Figure 9B:
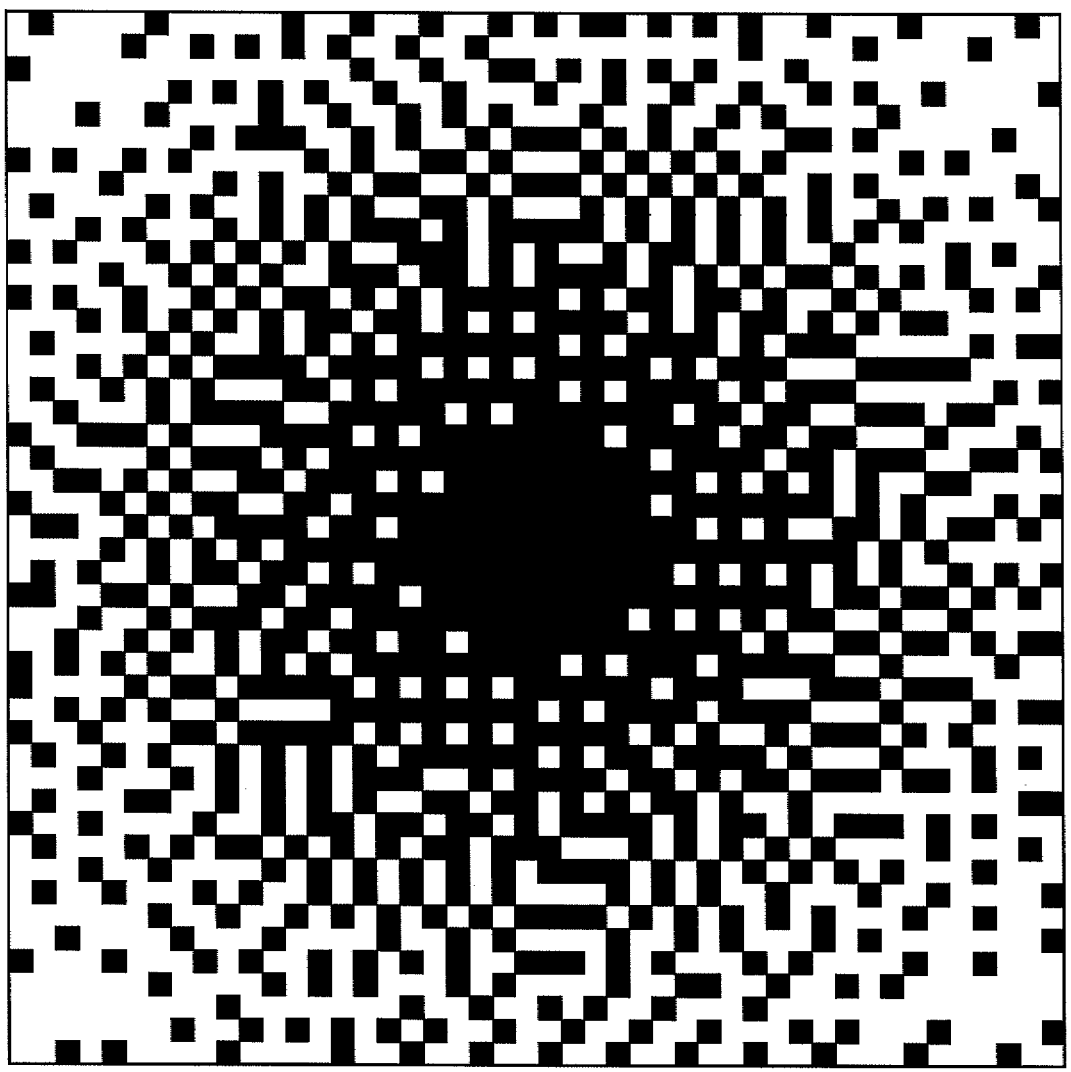

FIGS. 9A and 9B are diagrams showing a dot pattern obtained by the binarization process shown in FIGS. 6A to 6E. FIG. 9A shows rates (aperture ratios) of open grid cells in a range surrounded by frame A. FIG. 9B shows a dot pattern with zeros representing shields (dots) and ones representing apertures. As shown in FIG. 9A, the aperture ratios are 26% in the upper right region, 27% in the upper left region, 25% in the lower left region, and 26% in the lower right region.

Figure 10A:
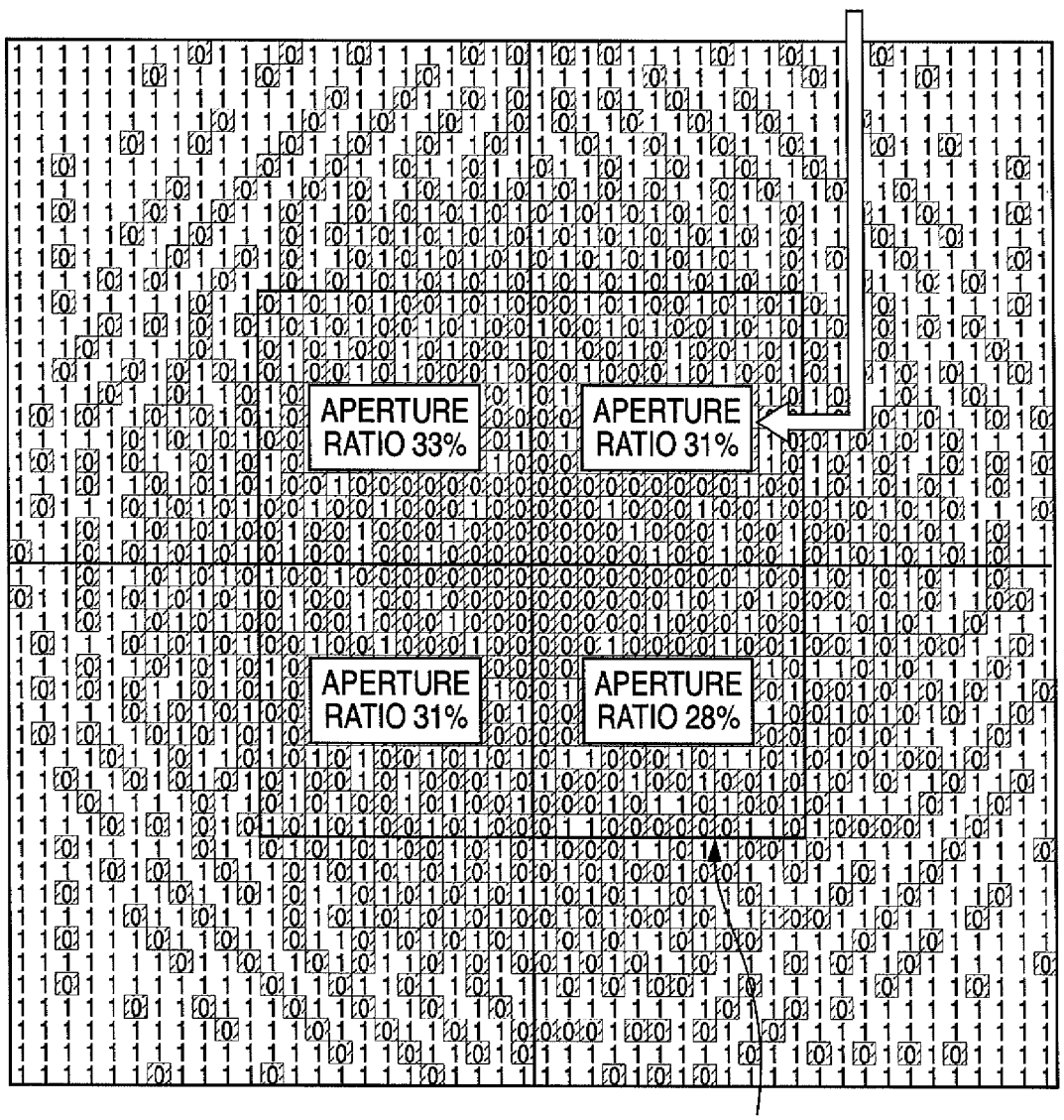
FIGS. 10A and 10B are diagrams showing a dot pattern obtained by a binarization process using a conventional error diffusion method.
Figure 10B:
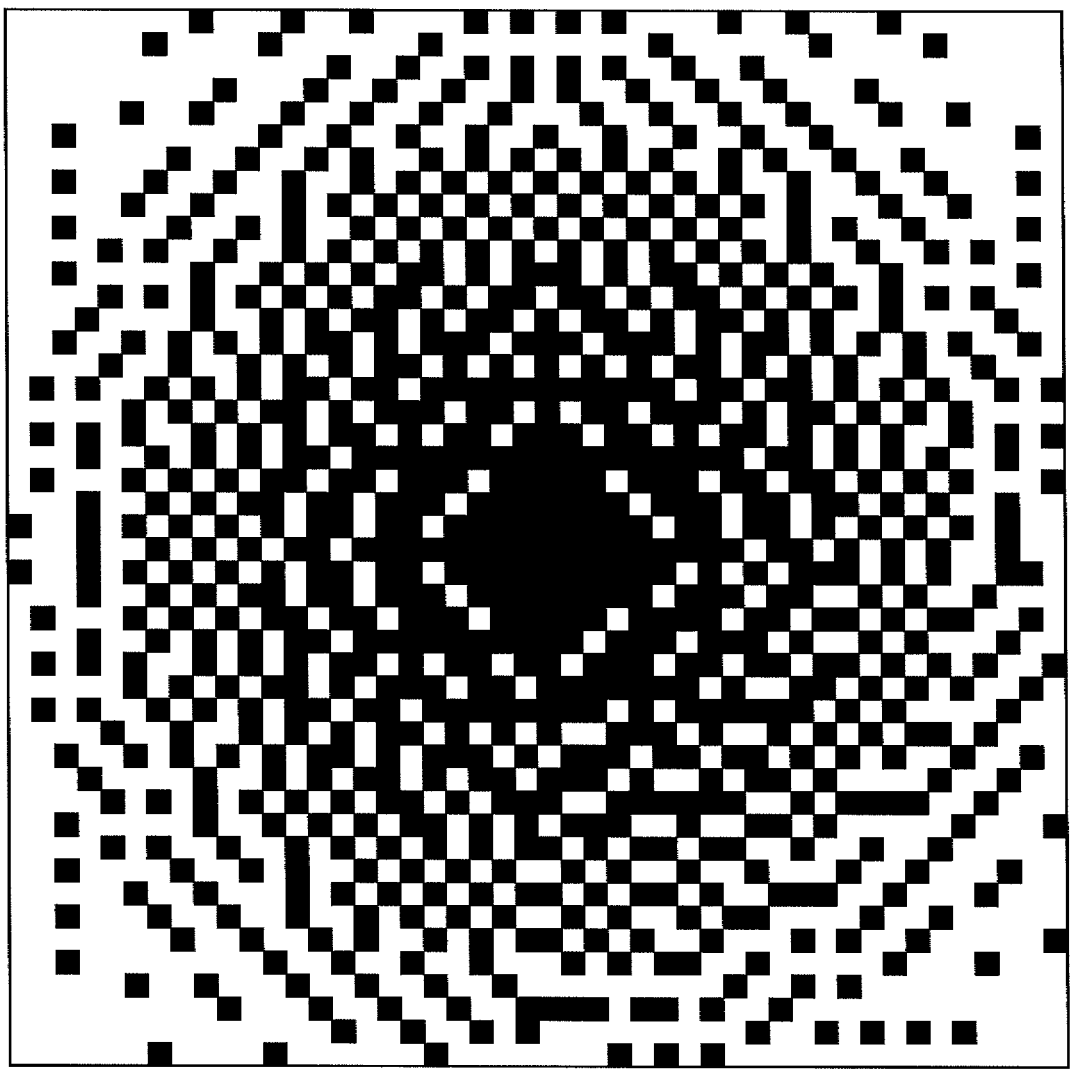

FIGS. 10A and 10B are diagrams showing, as a comparative example, a dot pattern resulting from a binarization process performed in directions from a pixel center to four corners using an error diffusion method described in Japanese Patent Laid-Open No. 2004-70087 (see FIG. 10A). FIG. 10A shows rates (aperture ratios) of open grid cells in a range surrounded by frame B. FIG. 10B shows a dot pattern with zeros representing shields (dots) and ones representing apertures. As shown in FIG. 10A, the aperture ratios are 31% in the upper right region, 33% in the upper left region, 31% in the lower left region, and 28% in the lower right region.

In this way, the dot pattern shown in FIGS. 9A and 9B has an aperture-ratio difference of only 2%, meaning an almost symmetrical arrangement. On the other hand, the dot pattern shown in FIGS. 10A and 10B has an aperture-ratio difference of 5% with a lower arrangement symmetry than the dot pattern shown in FIGS. 9A and 9B.

As described above, the binarization process according to the present embodiment can prevent dot pattern symmetry from lowering. This makes it possible to fabricate high-quality microlenses with a low distortion in lens shape.

It should be noted that, although the present embodiment described above uses data that is determined in Step S11 in FIG. 2, and which represents a transmitted light distribution of the mask pattern to be used for a photomask, the present invention may use data that is acquired (experimentally), in advance, and which represents a transmitted light distribution of the mask pattern to be used for a photomask.

Also, although the data, which represents the transmitted light distribution of the mask pattern to be used for a photomask, is used in the present embodiment described above, the present invention may use data that represents a shield quantity distribution of the mask pattern to be used for a photomask, alternatively.

Second Embodiment

Figure 8D:
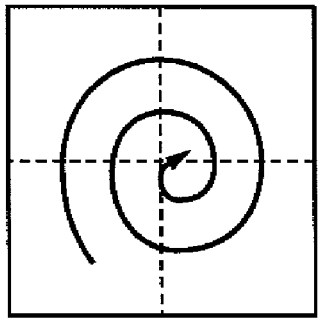
FIGS. 8A to 8D are diagrams illustrating a binarization process using an error diffusion method according to a second preferred embodiment of the present invention.
Figure 8C:
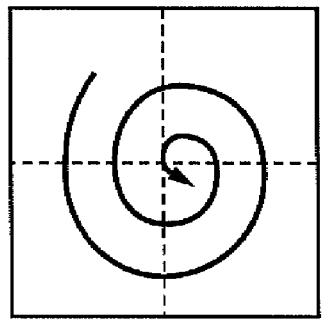
Figure 8B:
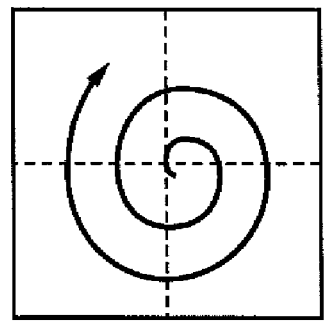
Figure 8A:
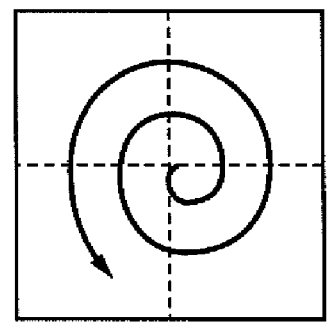

According to the first embodiment, a binarization process using the error diffusion method is performed in a spiral direction, in Step S13 shown in FIG. 2, as shown in FIG. 8A. However, a binarization process using the error diffusion method may be performed in another direction. Specifically, a binarization process may be performed clockwise, in order of increasing distance r from the pixel center shown in FIG. 8B. Alternatively, the binarization process may be performed in order of decreasing distance r from the pixel center, as shown in FIG. 8C or 8D. That is, to prevent symmetry from lowering, grid cells must be processed either in order of increasing distance r from the pixel center, or in order of decreasing distance r from the pixel center.

Third Embodiment

Figure 12A:
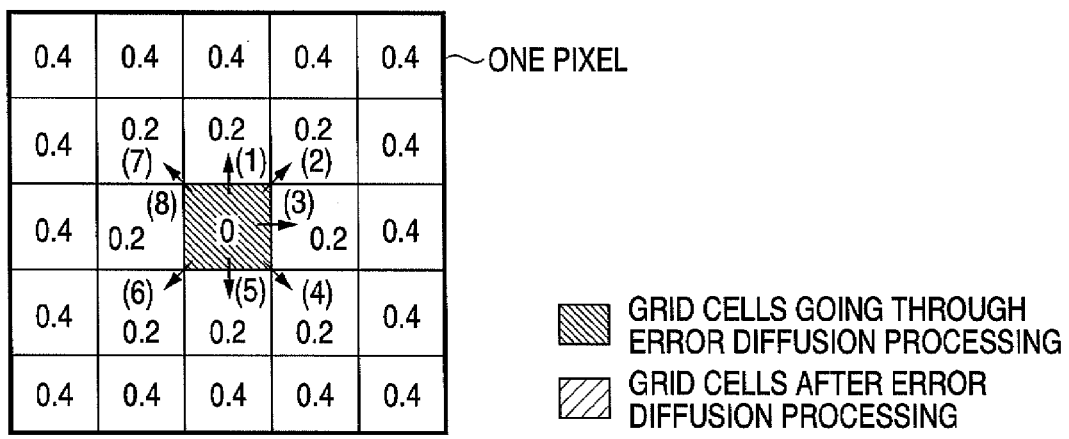
FIG. 12A is a diagram showing directions for weighted addition (or subtraction) of an error in a binarization process of a grid cell in the pixel according to the first embodiment.
Figure 12B:
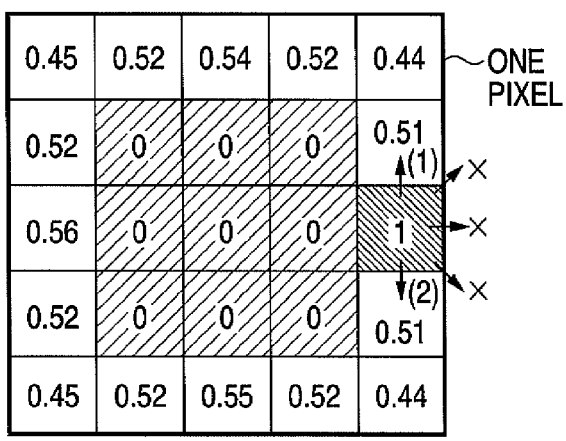
FIG. 12B is a diagram showing directions for weighted addition (or subtraction) of an error in a binarization process of an outermost grid cell in the pixel according to the first embodiment.

According to the first and second embodiments, in Step S13 shown in FIG. 2, a binarization process is performed using the grid cells obtained by dividing one pixel at predetermined intervals equal to the pitch $W_1$. This technique can prevent the symmetry of a generated dot pattern from lowering, but may not be able to reproduce the transmitted light distribution needed to obtain a desired lens shape. This is because, whereas grid cells located in an inner part of the pixel allow weighted addition (or subtraction) of an error in many directions (eight directions), as shown in FIG. 12A, the outermost grid cells allow weighted addition (or subtraction) of an error in a smaller number of direction (two directions), as shown in FIG. 12B. Thus, the outermost grid cells, which allow weighted addition (or subtraction) of an error with respect to a smaller number of grid cells, do not allow weighted addition (or subtraction) on the same level as the other grid cells. That is, the outermost grid cells may not be binarized properly.

Figure 12C:
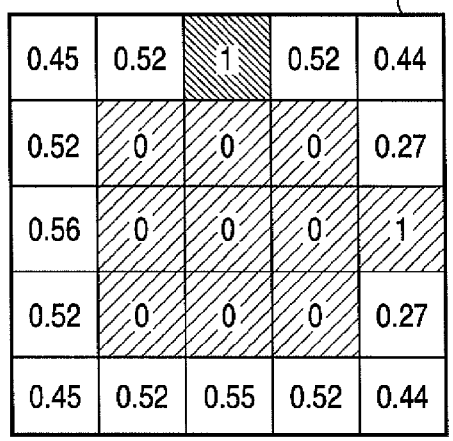
FIG. 12C is a diagram showing the results of the binarization process shown in FIG. 12B.
Figure 13A:
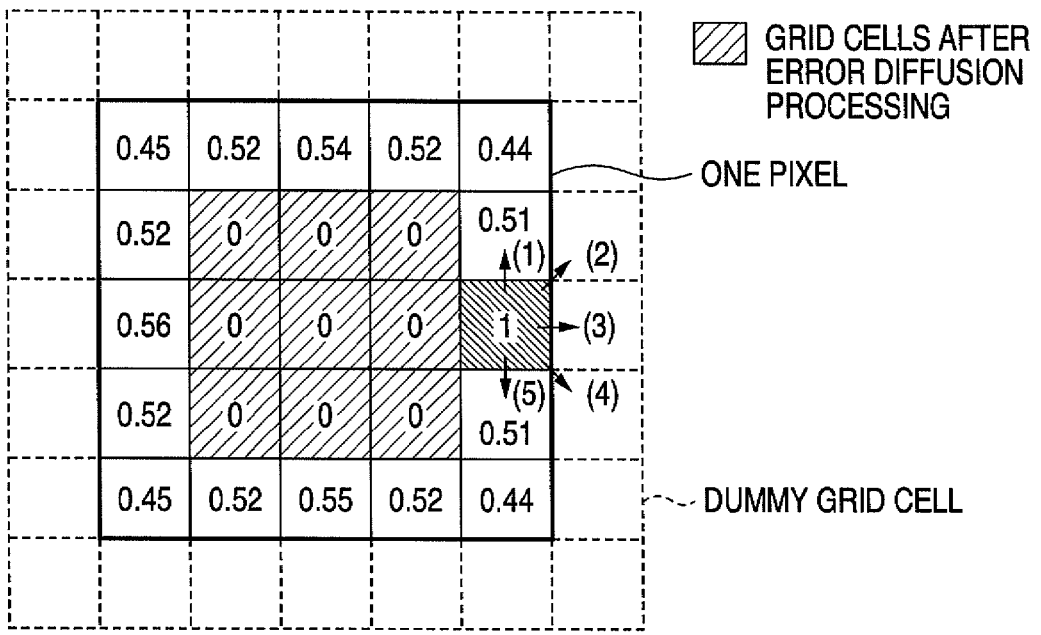
FIG. 13A is a diagram showing directions for weighted addition (or subtraction) of an error in a binarization process of an outermost grid cell in the pixel according to a third embodiment.

To solve the problem above, additional grid cells (dummy grid cells) can be placed outside the outermost grid cells of the pixel, in such a way as to adjoin the outermost grid cells, as shown in FIG. 13A. In this way, the binarization process can be performed after increasing the number of grid cells for weighted addition (or subtraction) of the errors of the outermost grid cells. This makes it possible to equalize the number of grid cells for weighted addition (or subtraction) of the error of each outermost grid cell with the number of grid cells for weighted addition (or subtraction) of the error of the inner grid cell in the pixel. The dummy grid cells are used only for weighted addition (or subtraction) of an error in a binarization process, and binarization results of the dummy grid cells are not used in Step S14 in FIG. 2. The use of dummy grid cells in the binarization process makes it possible to achieve an appropriate chrome shield arrangement and, consequently, to produce a dot pattern that can reproduce the transmitted light distribution needed to obtain a desired lens shape. FIG. 12C is a diagram showing results of error diffusion processing for an outermost grid cell when dummy grid cells are not used. The values of the grid cells adjacent to the processed grid cell after weighted addition (or subtraction) are different from the values of the given grid cells shown in FIG. 13B, in which dummy grid cells are used for weighted addition (or subtraction). The differences in the values correspond to deviations from the transmitted light distribution needed to obtain the desired lens shape.

The binarization method using dummy grid cells can produce proper results in the binarization of the outermost grid cells of the pixel, and the directions of binarization are not limited to those according to the first and second embodiments. The use of this method, in combination with the first and second embodiments, makes it possible to prevent symmetry from lowering, and to achieve the dot pattern arrangement needed to obtain the desired lens shape. Particularly, when a lens (the part having curvature) extends to the outermost area of the pixel, the method provides the dot pattern arrangement needed to obtain the desired lens shape.

(Application)

Figure 11:
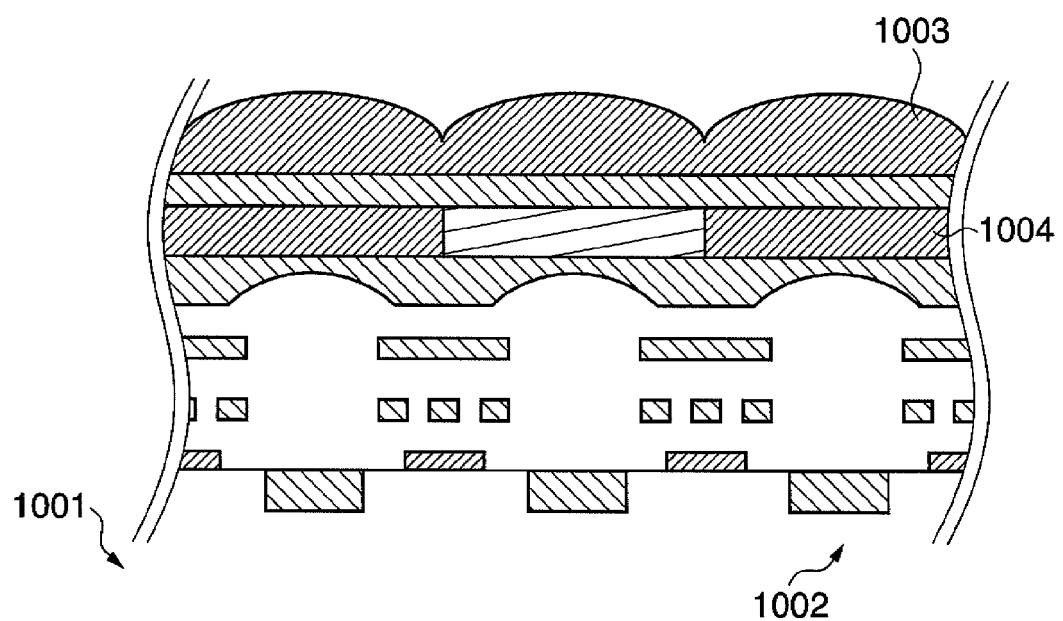
FIG. 11 is a diagram showing a configuration of an image sensing apparatus equipped with microlenses fabricated using the photomask fabrication systems according to a preferred embodiment of the present invention.
Figure 13B:
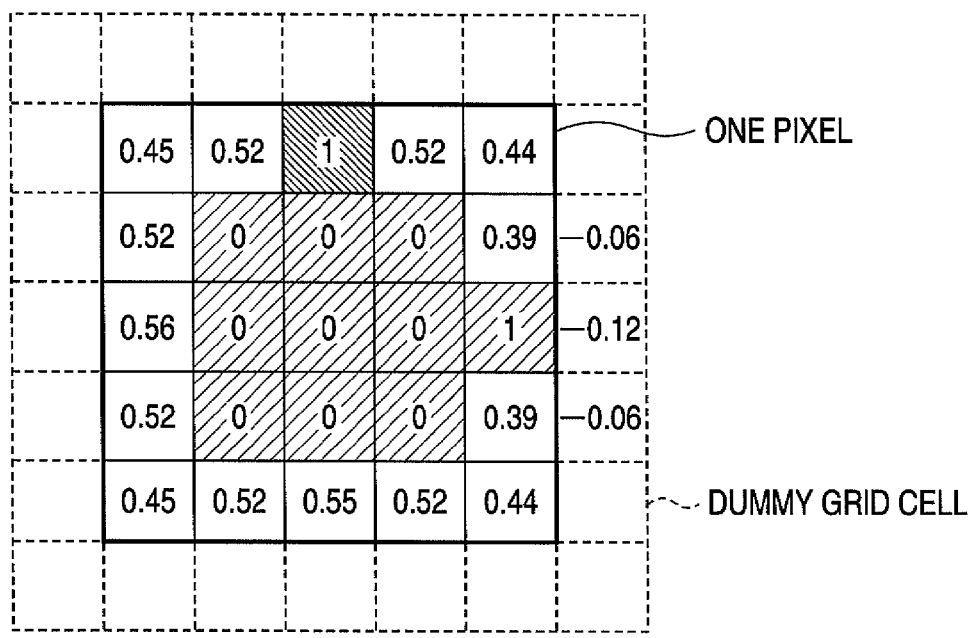
FIG. 13B is a diagram showing results of the binarization process shown in FIG. 13A.

FIG. 11 is a diagram showing a configuration of an image sensing apparatus equipped with microlenses fabricated using the photomask fabrication system 100 according to a preferred embodiment of the present invention. A plurality of pixels are arranged two-dimensionally in the image sensing apparatus and a microlens is placed on each of the pixels. Preferably, a plurality of mask patterns, obtained as described with reference to FIGS. 9A and 9B (or FIGS. 13A and 13B), is placed on the photomask (reticle). Incidentally, when the dummy grid cells shown in FIGS. 13A and 13B are used, after the mask pattern for the first pixel is formed, a plurality of the mask patterns with the dummy grid cells removed can be placed to form a mask pattern that accommodates multiple pixels. Using such a photomask (reticle), a plurality of microlenses (a microlens array) is formed on a substrate 1001 by a known lithographic technique. The image sensing apparatus includes a photoelectric conversion unit 1002 arranged on the substrate 1001, microlenses 1003 arranged two-dimensionally using the photomask fabrication system 100, and color filters 1004. The photoelectric conversion unit 1002 is a photodiode, or the like, which accumulates light by converting it into signal charges. The microlenses 1003 collect and focus light onto the photoelectric conversion unit 1002. The color filters 1004 are placed between the microlenses 1003 and the photoelectric conversion unit 1002.

Conventional microlenses are formed by heating and, thereby, softening a resin material. Therefore, some gap must be provided between adjacent microlenses to prevent them from joining together.

In contrast, according to the preferred embodiments of the present invention, microlenses 1003 are formed by exposing a photosensitive resin material placed under a photomask fabricated by the photomask fabrication system 100 and, then, developing the exposed photosensitive resin. This prevents the lens shape of the microlenses 1003 from distorting without the heating process. Consequently, the present invention makes it possible to greatly reduce the gap between the microlenses.

While the present invention has been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

What is claimed is:

1. A method, performed by a computer, of generating mask pattern data of a photomask used to form microlenses, the method comprising the steps of:
    dividing a pattern formation surface of a mask pattern to be used for the photomask into a plurality of grid cells;
    acquiring data which represents a transmitted light distribution of the mask pattern to be used for the photomask; and
    determining whether to place a shield on each of the plurality of grid cells by binarizing the plurality of grid cells in order of increasing or decreasing distance from a center of the pattern formation surface using an error diffusion method to acquire the transmitted light distribution.

2. A method of generating mask pattern data according to claim 1, wherein the plurality of grid cells are binarized clockwise in the determining step.

3. A method of generating mask pattern data according to claim 1, wherein the plurality of grid cells are binarized counterclockwise in the determining step.

4. A method of generating mask pattern data according to claim 1, wherein one side of each of the plurality of grid cells is equal to or smaller in length than a minimum resolvable distance of an exposure apparatus used for the photomask.

5. A method of generating mask pattern data according to claim 1, wherein the plurality of grid cells are square.

6. A method of generating mask pattern data according to claim 1, wherein the determining step places additional grid cells outside outermost grid cells of the plurality of grid cells and binarizes the outermost grid cells using the additional grid cells.

7. An information processing apparatus, comprising:
  a unit configured to divide a pattern formation surface of a mask pattern to be used for a photomask into a plurality of grid cells;
  a unit configured to acquire data which represents a transmitted light distribution of the mask pattern to be used for a photomask used to form microlenses; and
  a unit configured to determine whether to place a shield on each of the plurality of grid cells by binarizing the plurality of grid cells in order of increasing or decreasing distance from a center of the pattern formation surface using an error diffusion method to acquire the transmitted light distribution.

8. A photomask fabrication system comprising:
an information processing apparatus according to claim 7; and
a drawing apparatus configured to fabricate a photomask based on mask pattern data generated by the information processing apparatus.

9. An image sensing apparatus comprising:
a photoelectric conversion unit configured to convert light into signal charges;
a microlens formed using a photomask fabricated by a photomask fabrication system according to claim 8 and configured to collect and to focus light onto the photoelectric conversion unit.

* * * * *